United States Patent [19]

Rice et al.

[11] Patent Number: 5,477,975

[45] Date of Patent: Dec. 26, 1995

[54] PLASMA ETCH APPARATUS WITH HEATED SCAVENGING SURFACES

[76] Inventors: Michael Rice, 675 Claret Ct., Pleasanton, Calif. 94566; Jeffrey Marks, 4730 Cielo Vista, San Jose, Calif. 95129; David W. Groechel, 27985 Via Ventana, Los Altos Hills, Calif. 94022; Nicolas J. Bright, 12133 Kirkbrook Dr., Saratoga, Calif. 95070

[21] Appl. No.: 138,060

[22] Filed: Oct. 15, 1993

[51] Int. Cl.$^6$ .................................................. H05H 1/00
[52] U.S. Cl. ...................... 216/68; 216/67; 216/74; 216/80; 156/643.1; 156/646.1; 156/345; 204/298.31; 204/298.34
[58] Field of Search .................. 156/662.1, 345, 156/643.1, 646.1; 118/723 E, 723 I, 725; 204/298.34, 298.31, 298.09, 192.32; 216/68, 67, 74, 80

[56] References Cited

U.S. PATENT DOCUMENTS

| 4,427,516 | 3/1983 | Levinstein et al. | 204/192 |
| 5,000,113 | 3/1991 | Wang et al. | 118/723 |
| 5,203,956 | 4/1993 | Hansen | 156/643 |

FOREIGN PATENT DOCUMENTS

| 0520519A1 | 12/1992 | European Pat. Off. |
| 0552491A1 | 7/1993 | European Pat. Off. |
| 62-012129 | 1/1987 | Japan |

OTHER PUBLICATIONS

W. Coburn, "Increasing the etch rate ratio of SiO/Si In Fluorocarbon Plasma Etching," BM Technical Disclosure Bulletin, vol. 19 No. 10, Mar. 1977.

Seitaro Matsuo, "Selective Etching of SiO Relative to Si by Plasma Reactive Sputter Etching,": J. Vac. Sci. Technol., 17 (2), Mar./Apr. 1980, American Vacuum Society, 1980.

Primary Examiner—Thi Dang
Attorney, Agent, or Firm—Richard T. Lyon

[57] ABSTRACT

The invention is embodied in a method of operating a plasma etch reactor, consisting of introducing a gas into the reactor which disassociates as a plasma into an etch species which etches oxide films on a work piece in the reactor and a non-etching species combinable with the etch species into an etch-preventing polymer condensable onto the work piece below a characteristic deposition temperature, providing an interior wall comprising a material which scavenges the etching species, and maintaining a temperature of the interior wall above the deposition temperature.

49 Claims, 5 Drawing Sheets

PLASMA ETCH APPARATUS WITH HEATED SCAVENGING SURFACES

BACKGROUND OF THE INVENTION

1. Technical Field

The invention is related to RF plasma etch reactors capable of high selectivity between etching of oxide films (such as silicon dioxide) and non-oxide surfaces (such as polysilicon or silicon nitride films).

2. Background Art

European Patent Document No. 0,520,519 A1 discloses a novel inductively coupled plasma etch reactor for etching thin films formed on a silicon wafer using an RF plasma etch process, the disclosure of which is incorporated herein by reference. Such a reactor can be used to selectively etch silicon dioxide over non-oxide (e.g., silicon nitride) films on the wafer. Specifically, a carbon-fluorine gas such as $C_2F_6$ is excited sufficiently to generate a plasma within the reactor chamber, producing ions and free radicals including F and $CF_3$, for example. The F radicals etch any silicon dioxide film on the wafer, while carbon and fluorine atoms or ions in the plasma combine on the wafer surface to form a polymer. The polymer disassociates when formed on silicon dioxide surfaces due to the effect of oxygen freed from the silicon dioxide film during the etch process, and due to effect of fluorine in the plasma. However, when formed on a non-oxide film (e.g., silicon nitride), the polymer accumulates due to the lack of oxygen in the underlying non-oxide film, this formation inhibiting etching of the underlying non-oxide film, thereby providing a pronounced etch selectivity of the oxide film over the non-oxide film. This selectivity is of great advantage when etching vias through a silicon dioxide layer overlying a non-oxide layer (e.g., polysilicon) which is not to be etched. The selectivity is limited if the polymer formed over the polysilicon layer contains more than 40% fluorine by weight, because such polymers are susceptible to being attacked by fluorine in the plasma, and therefore provide only limited protection to the underlying polysilicon layer.

U.S. patent application Ser. No. 07/941,501 filed Sep. 8, 1992 by Marks et al. entitled "Selectivity for Etching an Oxide Over a Nitride" discloses how to use an inductively coupled plasma reactor of the type disclosed in the above-referenced European Patent Document to form a carbon polymer film having less than 40% fluorine over a non-oxide (i.e., silicon nitride) film. This improvement is realized by increasing the proportion of carbon in the plasma relative to fluorine, and is accomplished by introducing a fluorine scavenger into the plasma. One such scavenger is silane gas, for example. The silicon in the silane gas combines with free fluorine atoms in the plasma to form $SF_4$ gas, which is readily pumped out of the reactor chamber. The effect of this improvement is that the carbon-rich polymer formed over the silicon nitride film is impervious to fluorine in the plasma and thereby provides a virtually infinite selectivity of silicon dioxide etch rate to silicon nitride etch rate.

U.S. patent application Ser. No. 07/984,045 filed Dec. 1, 1992 by Collins et al. and U.S. patent application Serial No. 07/941,507 filed Sep. 8, 1992 by Collins et al. disclose, respectively, a capacitively and an inductively coupled plasma etch apparatus in which a fluorine scavenger material is introduced into the reactor chamber to achieve the same type of advantages as realized in the above-referenced Marks et al. application. This material is in the form of a silicon ceiling inside the reactor chamber. The silicon ceiling emits silicon atoms into the plasma which scavenge fluorine out of the plasma, providing the desired carbon-to-fluorine ratio in the plasma to form a carbon-rich polymer impervious to fluorine in the plasma over the non-oxide (e.g., silicon nitride) film.

The problem with the foregoing techniques is that in many types of reactors, particularly the inductively coupled reactors of the type disclosed in the above-referenced European Patent Document, the chamber side walls are preferably formed of quartz (silicon dioxide) because the silicon dioxide atoms on the wall surface etch to provide silicon and oxygen atoms. The silicon atoms scavenge fluorine out of the plasma, with the desired effects described above. To a lesser extent, the oxygen atoms combine with carbon atoms in the plasma to scavenge carbon, but this is a minor effect.

The quartz side walls are susceptible to cooling each time the reactor is idled and the plasma turned off, which is typical whenever a new cassette of wafers is introduced or whenever the chamber must be opened for maintenance, for example. The side walls typically fall below 170 degrees C., which is the deposition temperature below which the carbon-fluorine polymer condenses. As soon as the plasma is ignited again, the carbon-fluorine polymer formed from the plasma condenses very rapidly onto the now-cool quartz side walls, forming a very thick polymer coating. As each wafer is cycled through the chamber, the temperature of the side wall climbs, dropping slightly and temporarily as the plasma is turned off briefly with the introduction of each new wafer, but making steady overall progress upward to its stead-state temperature, as illustrated in FIG. 1. In the meantime, because the quartz side wall is attracting so much of the polymer, very little is available to protect the non-oxide (e.g., polysilicon or silicon nitride) film on the wafer from being etched, and so the oxide-to-non-oxide etch selectivity is below the required level during the processing of the first several wafers.

Eventually, the temperature of the quartz side wall climbs above 170 degrees C., and the thick polymer coating suddenly vaporizes from the now-hot side wall and covers the new wafer currently being processed in the reactor chamber, interfering with the etch process.

One way around the foregoing problem is to delay the introduction of production wafers into the chamber until the quartz side wall temperature is well-above 170 degrees C., but such an expedient involves an unacceptable loss of time as well as loss of materials (i.e., the silicon and quartz scavenging materials inside the reactor chamber). Accordingly there is a need to solve the foregoing problem without loss of production time and without waste of chamber materials.

SUMMARY OF THE DISCLOSURE

The invention is embodied in a plasma etch reactor in which a gas is introduced which disassociates as a plasma into an etch species which etches oxide films on a work piece in the reactor and a non-etching species combinable with the etch species into an etch-preventing polymer condensable onto the work piece below a characteristic deposition temperature, the reactor including an interior wall comprising a material which scavenges the etching species, there being means provided for maintaining a temperature of the interior wall above the deposition temperature. Increasing the wall temperature above the deposition temperature increases the etch rate of the hot quartz surface, which scavenges fluorine and increases the etch selectivity of the oxide film over the oxide-free under-layer.

DETAILED DESCRIPTION OF THE PREFERRED EMBODIMENT

The problem of deposition and vaporization of polymer on the quartz side wall is eliminated without any loss of productivity and without waste of any chamber materials by a thermal control system including a cooling device with greater capacity than the heat flow from the plasma and a heating device controlling the temperature of the side walls and having greater capacity than the cooling device. The side wall heating device is regulated to maintain the temperature of the quartz side walls above the polymer condensation temperature of 170 degrees C. whenever the reactor is idle. In order to minimize the temperature increase on the inside surface of the quartz wall when the plasma is ignited, the heating device stops heating the quartz side wall immediately upon ignition of the plasma. In regulating the quartz side wall temperature, the heating device employs a feedback control loop responding to a temperature sensor attached to the quartz side wall. For simplicity, the temperature sensor is attached to the outer surface of the quartz side wall and the heating device maintains a predetermined temperature gradient between the interior and exterior side wall surfaces.

Figure 1:
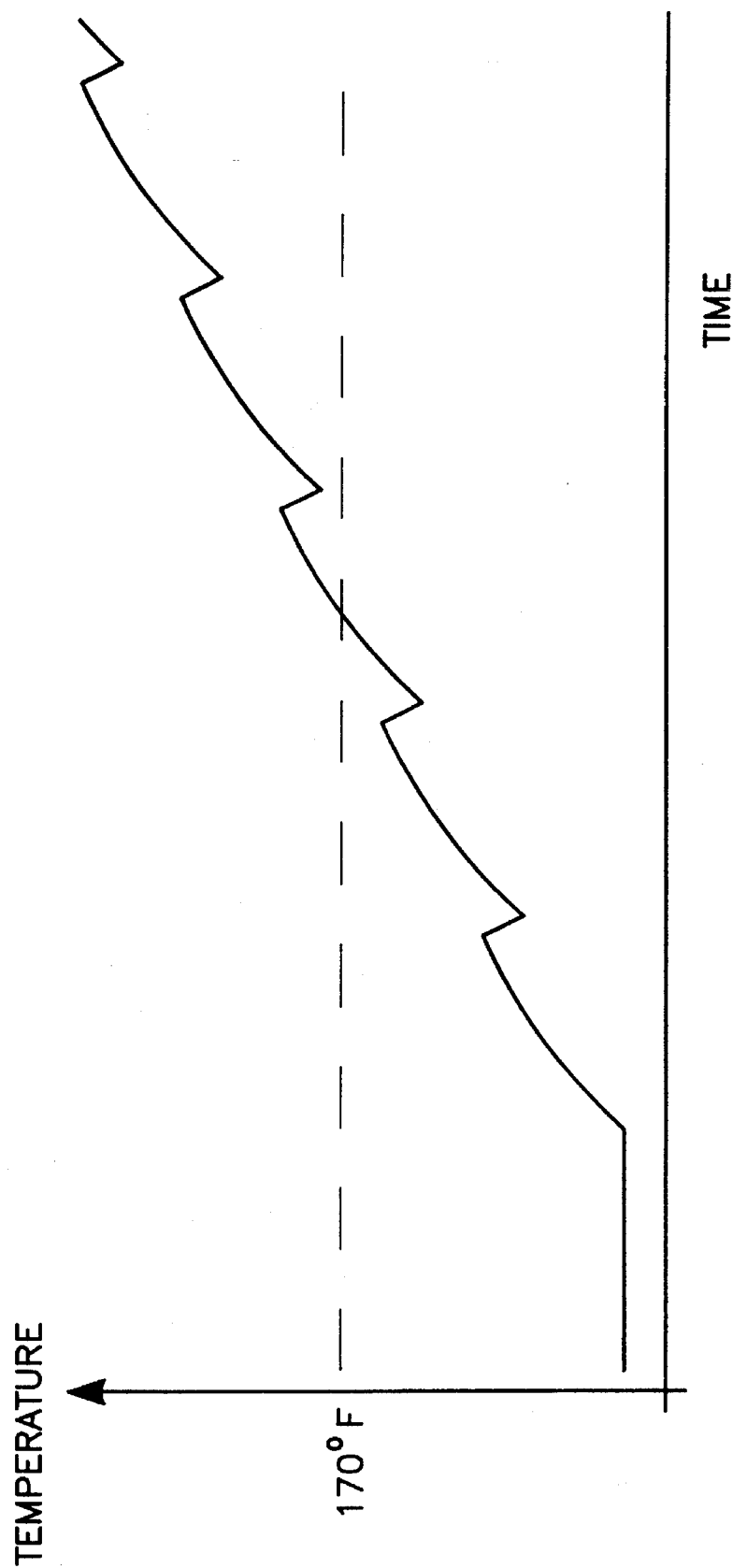
FIG. 1 is a graph illustrating the side wall temperature as a function of time in an inductively coupled plasma reactor of the type antedating the discovery of the present invention.
Figure 2:
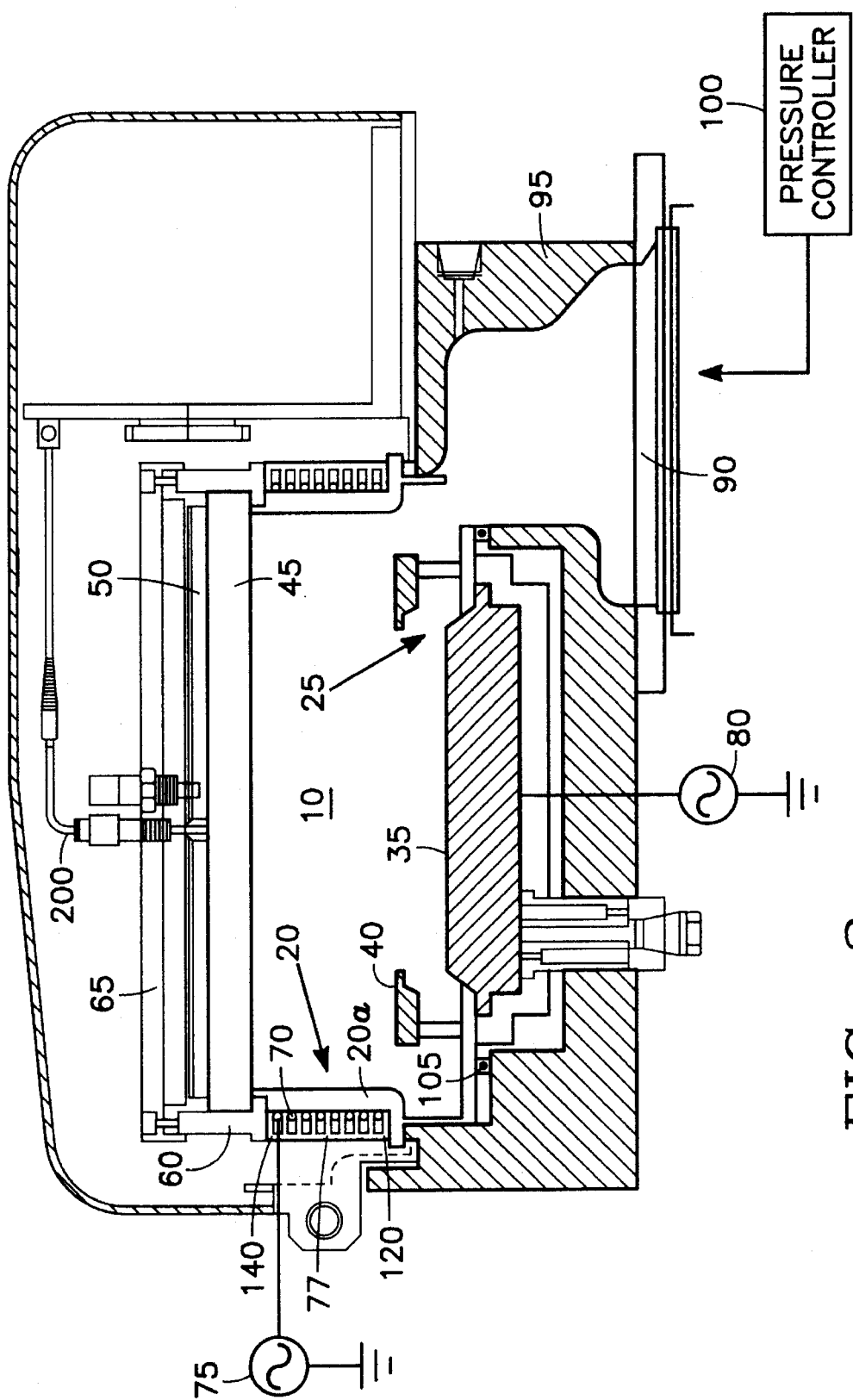
FIG. 2 is a simplified diagram of an inductively coupled plasma reactor embodying the present invention.
Figure 3:
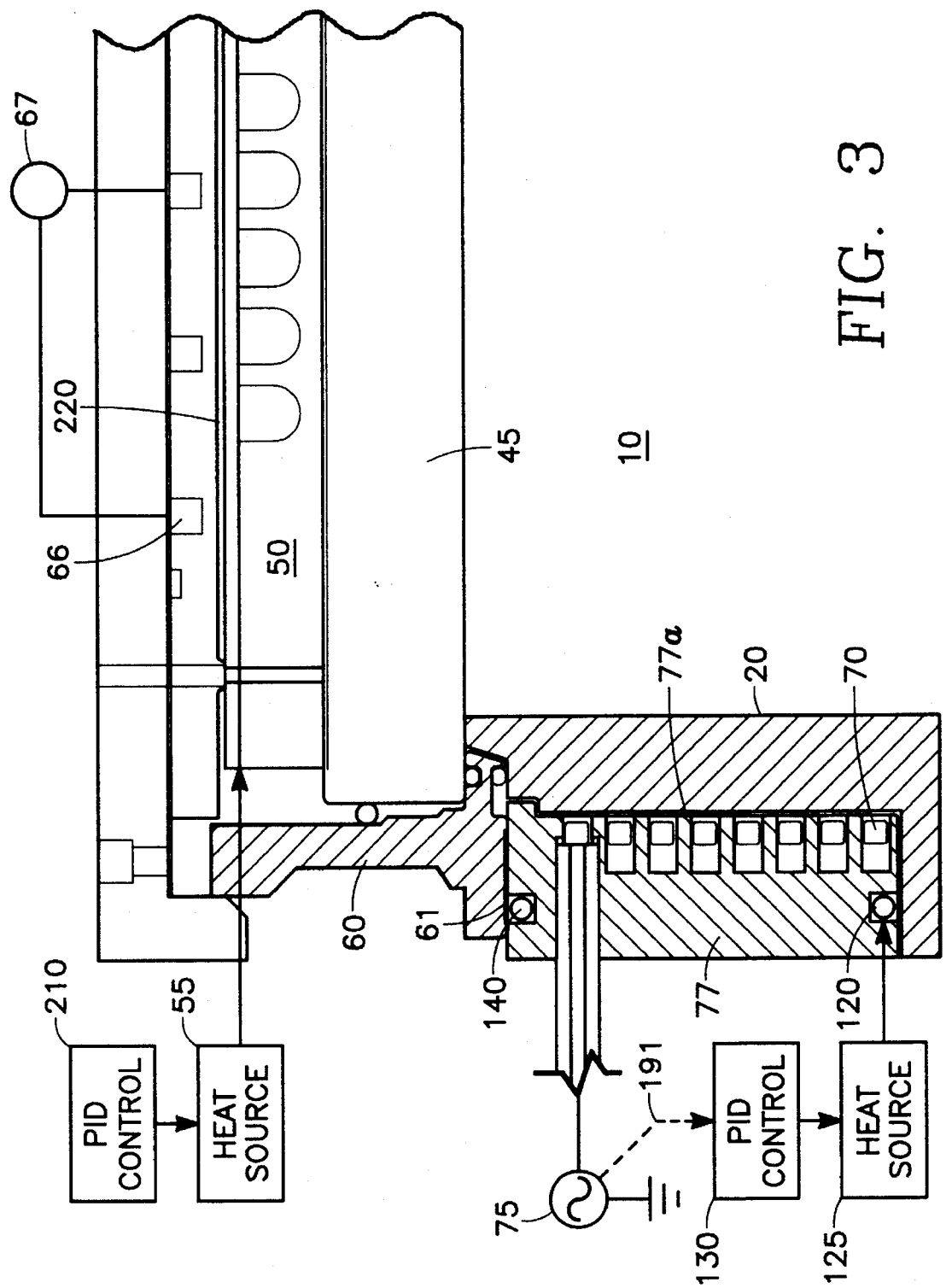
FIG. 3 is a detailed diagram of a portion of the reactor of FIG. 2.

Referring to FIG. 2, an inductively coupled plasma reactor of the general type described in the above-referenced European Patent Document includes a vacuum chamber 10 enclosed by a cylindrical quartz side wall 20, a bottom 25 including a cathode assembly on which a silicon wafer 35 is held by a retractable annular holder 40. The ceiling 45 is crystalline silicon heated by an overlying heating element 50 connected to a temperature-controlling heat source 55. A cylindrical aluminum top wall 60 rests on a 0.025 cm-thick polyamide pad 61 on the quartz side wall 20 and supports an overlying discoid cooling element 65 in which coolant is circulated through water jackets 66 by a pump 67 as shown in FIG. 3. This cools the quartz side wall 20 through the aluminum cylindrical top wall 60.

A helical cylindrical antenna coil 70 is wrapped around the cylindrical quartz side wall 20 and is connected to an RF energy source 75 providing the inductive coupling energy to the plasma in the chamber 10. A ceramic cylindrical cover 77 such as $Al_2O_3$ or $Si_2N_4$ surrounds the antenna coil 70. The cathode assembly 30 is connected to an RF bias source 80, which furnishes the bias energy to the wafer 35.

A gate valve/vacuum pump assembly 90 draws gas from the chamber 10 through an opening in the chamber body 95 to maintain a vacuum in the chamber 10 determined by a pressure control device 100. A gas feed 105 feeds gases such as $C_2F_6$ into the chamber 10.

In order to maintain the temperature of the interior surface 20a of the quartz sidewall 20 well-above 170 degrees C., a heating element 120 best shown in FIG. 3 rests in the interior of the ceramic cover 77 near the bottom of the quartz side wall 20 and is connected to an electrical source 125 shown in FIG. 2. The heating element 120 is preferably a cable heater manufactured by Watlow, Inc., 12001 Lackland Road, St. Louis, Mo. If the chamber 10 is large enough to hold an 8-inch wafer, then the cable heater is approximately 45 inches long and is wrapped in a circle, with its sheath electrically grounded. Preferably, it is operated by applying 1100 watts at 208 volts. In order to avoid electromagnetic interference with the plasma, the two ends of the cable heater do not touch but instead are separated by preferably about 2.5 cm. Alternatively, a second heating element or cable heater 140 may be placed near the top of the quartz side wall 20, in which case each cable heater 120, 140 is operated at 550 watts.

In order to provide accurate temperature control of the quartz side wall 20, a temperature sensor such as a thermocouple 190 mounted on the outer surface of the ceramic cover 77 surrounding the quartz side wall 20 is connected to an input of the temperature controller 130. Typically, there is a temperature gradient of about 30 to 40 degrees C. between the interior surface of the quartz side wall 20 and the exterior surface of the ceramic cover 77. The controller 130 is programmed to maintain the outer surface of the ceramic cover 77 at about 200 degrees C. when the system is idle. When plasma is ignited, heat is transferred into and through the quartz side wall 20, through a small air gap 77a (typically 0.0075 cm) and into the ceramic cover 77. In the preferred embodiment, the heater 120 is turned off (by switching off from the heat source 125) as long as there is a plasma in the chamber 10. This allows the temperature of the ceramic cover 77 to fall slightly, which minimizes the increase in temperature of the inside surface of the quartz side wall 20. In a preferred embodiment, the temperature controller 130 is a conventional PID (proportional integral differential) controller which is readily programmed by the skilled worker.

The PID controller 130 is preferably programmed to turn off electrical power to the cable heater 120 (and 140) whenever the plasma is ignited in the chamber 10 and to turn on electrical power to the cable heater 120 (and 140) as soon as the plasma is turned off as sensed via a control line 191 from the RF generator 75.

A necessary condition for stable temperature control of the quartz side wall 20 is that the heat flow from the plasma in the chamber 10 through the quartz side wall 20 must be less than the heat flow from the cooling provided by the coolant circulator 67, which in turn must be less than the heat flow from the heating element 120. Heat flow between the interior surface of the quartz side wall 20 and the outer surface of the ceramic cover 77 is set by conduction through the air gap 77a therebetween. The air gap 77a exhibits in a preferred embodiment a thermal conductivity of about 0.02 watts per meter-degree C., the thermal conductivities of the quartz side wall 20 and ceramic cover 77 being 1.5 and 20 watts per meter-degrees C., respectively. Heat flow from the quartz side wall 20 and cooling top 65 is set by conduction through a 0.025 centimeter thick polyamide pad 61 between the top of the ceramic cover 77 and the bottom of the cooling top 77. Because the quartz side wall 20 is physically remote from the cooling device 65, the heat source 125 is turned off whenever the plasma is ignited in the chamber 10 to avoid a reduce the temperature rise to between 10 and 20 degrees C. on the inside surface of the quartz wall 20.

The temperature of the silicon ceiling 45, as noted above, determines the rate at which silicon atoms are emitted therefrom into the plasma within the chamber 10, and therefore affects the carbon-to-fluorine content ratio. Accordingly, the silicon ceiling 45 is maintained at a temperature corresponding to a carbon/fluorine plasma ratio providing a polymer carbon content greater than 60% by weight. Such temperature control of the ceiling 45 is provided by a conventional PID controller 210 governing the ceiling heat source 55 in accordance with a signal received from a temperature sensor or thermocouple 200 attached to the silicon ceiling 45. The PID controller 210 is readily programmed by the skilled worker to maintain the silicon ceiling at the requisite temperature for a given carbon-content of the polymer formed on non-oxide (e.g., polysilicon or silicon nitride) surfaces on the wafer 35. Heat conduction to the silicon ceiling 45 is set by a suitable air gap 220 between the heater 50 and the ceiling 45 similar to the air gap 77a. A necessary condition for stable temperature control of the silicon ceiling 45 is that the heat flow from the plasma in the chamber 10 through the ceiling 45 must be less than the heat flow from the cooling provided by the coolant circulator 67, which in turn must be less than the heat flow from the heating element 50. Accordingly, in a preferred embodiment, the heater 50 provides 4500 watts while 2500 watts of cooling is available to the ceiling from the cooling device 65. The plasma in the chamber 10 generates only 1500 watts of heat in the ceiling, and therefore the temperature control loop comprising the PID controller 210 is capable of regulating the silicon ceiling temperature at all times, even when a plasma is ignited in the chamber 10.

Working Example

In one example, the inductively-coupled RF source 75 produced 2800 watts at 2 MHz, the bias RF source 80 produced 1400 watts at 1.8 MHz, the heat source 55 was set to maintain the temperature of the silicon ceiling 50 at 260 degrees C., the heat source 125 was set to maintain the temperature of the inside surface of the quartz wall at 200 degrees C., and the flow of $C_2F_6$ through the gas feed was 35 standard cubic centimeters per minute in a reactor chamber of 17 liters (including the portion up to the gate valve/vacuum pump assembly 90) at a chamber pressure of 5 milliTorr.

Generally, the source RF power of the RF source 75 is in the range of 2000 to 3000 watts at about 2 MHz, the bias RF power of the RF source 80 is in the range of 500 to 1500 watts at 1.8 MHz (depending upon the size of the wafer 35), the silicon roof temperature is in the range of 200 to 300 degrees C., the quartz side wall interior surface temperature is in a range between 170 and 230 degrees C., the $C_2F_6$ gas flow rate is between 20 and 50 standard cubic centimeters per minute and the chamber pressure is between 1 and 10 milliTorr.

If the temperature of the quartz wall 20 is varied from 210 to 225 degrees C., then the etch selectivity ratio of oxide to polysilicon increases from about 15 to 19 while the oxide etch rate decreases by about 10%. The oxide etch rate decreases because the increased temperature of the quartz wall 20 provides more silicon atoms to scavenge fluorine for an enriched and therefore impervious polymer coating on the underlying polysilicon layer, but less fluorine for etching the overlying oxide.

Figure 4:
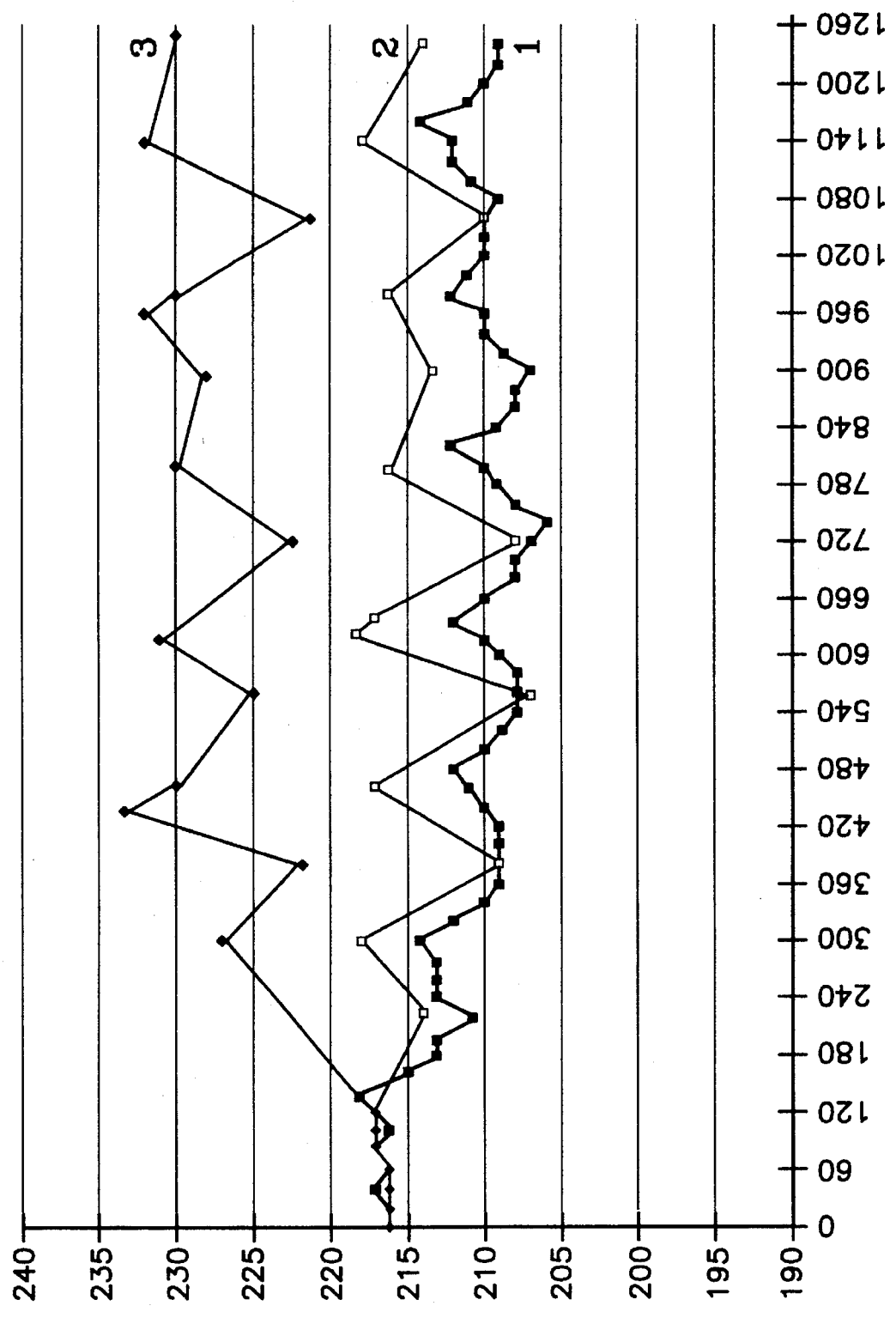
FIG. 4 is a graph of temperature as a function of time at three distinct locations indicated in FIG. 3.
Figure 5:
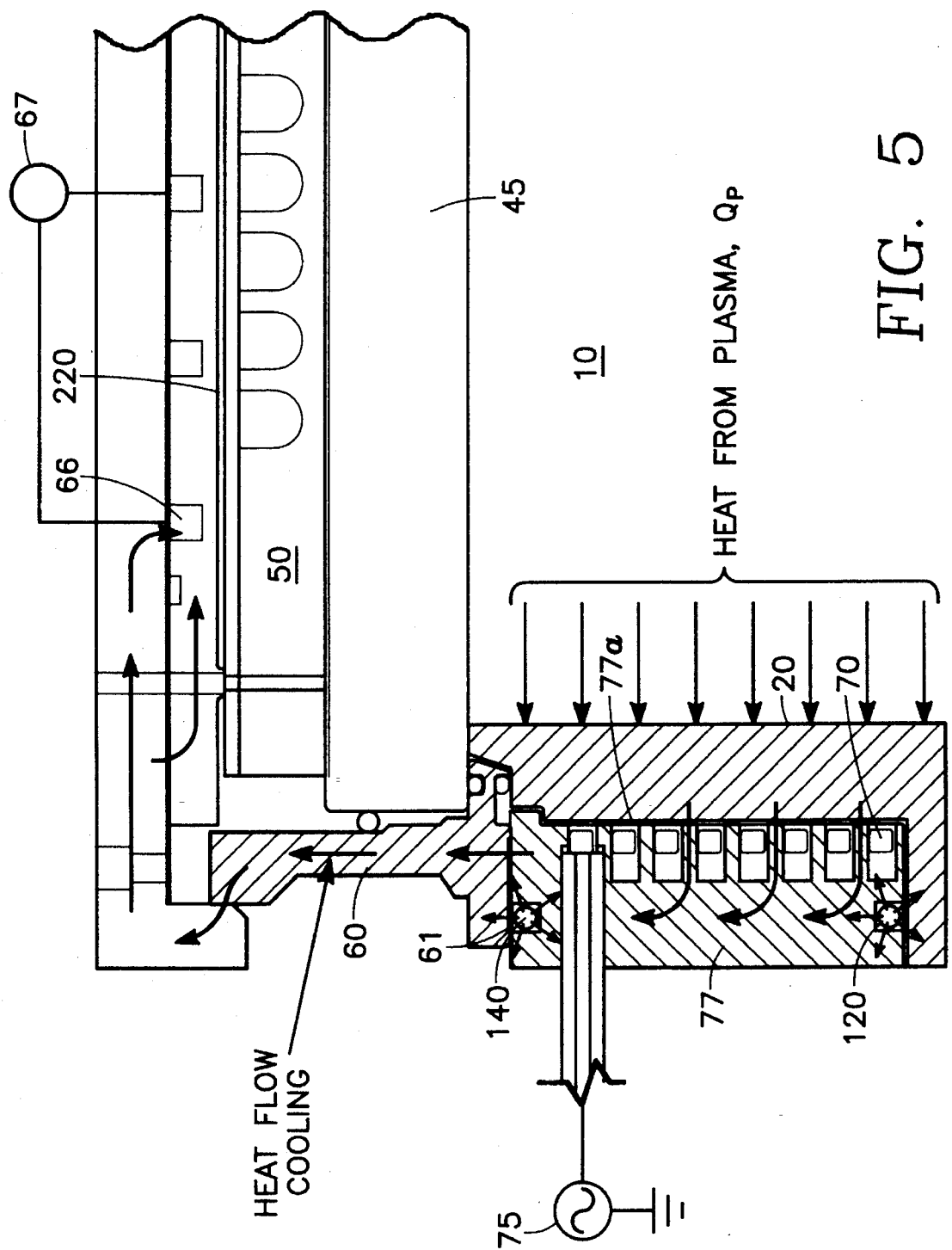
FIG. 5 is a diagram illustrating thermal conduction paths in the apparatus of FIG. 3.

FIG. 4 is a graph illustrating the temperature stability achieved by the present invention, showing the temperature as a function of time at three locations on the quartz side wall 20 numbered 1,2,3, respectively in FIG. 3. The quartz side wall temperature idles at about 216 degrees C. while the reactor is idle (during the first 60 seconds of the graph of FIG. 4), and then fluctuates as the plasma is re-ignited with each new wafer being processed. The data reflects a period of 45 seconds of loading without a plasma and 90 seconds of plasma processing for the first six wafers being processed. After that, there is an extended idle time while the wafer cassette is changed or the chamber is cleaned. FIG. 5 illustrates various heat conduction paths in the apparatus of FIG. 3.

While the invention has been described in detail by specific reference to preferred embodiments thereof, it is understood that variations and modifications thereof may be made without departing from the true spirit and scope of the invention.

What is claimed is:

1. A method of operating a plasma reactor, comprising:

introducing a gas into said reactor which dissociates as a plasma into an etch species which is capable of etching oxide films on a work piece in the reactor and a non-etching species combinable with the etch species into an etch-preventing polymer condensable onto the work piece below a characteristic temperature;

providing an interior wall comprising a material which scavenges said etching species;

maintaining a temperature of said interior wall above said characteristic deposition temperature of said etch-preventing polymer, wherein said maintaining step comprises;

providing a heating element near said interior wall;

applying sufficient power to said heating element so as to maintain the temperature of said interior wall above said characteristic deposition temperature; and refraining from applying power to said heating element whenever a plasma is ignited in said reactor.

2. The method of claim 2 wherein said reactor further comprises an article within said reactor containing a material which scavenges said etching species, said method further comprising:

maintaining a temperature of said article at a temperature corresponding to a desired content ratio of said non-etching species and said etching species in said plasma.

3. The method of claim 2 wherein said desired content ratio in said plasma corresponds to a content ratio of said non-etching species in said polymer at which said polymer is impervious to attack by said etching species in said plasma.

4. The method of claim 3 wherein said etching species comprises fluorine and said non-etching species comprises carbon and wherein said gas comprises a carbon-fluorine gas.

5. The method of claim 4 wherein said interior wall comprises quartz and said scavenging article comprises silicon.

6. The method of claim 2 wherein said step of maintaining the temperature of said interior wall further comprises:

providing a cooling element in said reactor;

providing a cooling thermal path between said interior wall and said cooling element having a first heat flow rate greater than a heat flow rate from said plasma to said interior wall; and providing a heating thermal path between said interior wall and said heating element having a heat flow rate greater than said first heat flow rate.

7. The method of claim 6 wherein the step of providing a cooling thermal path comprises setting a heat flow rate of said cooling thermal path by placing a first thermally resistant element in said cooling thermal path.

8. The method of claim 7 wherein said first thermally resistant element comprises polyamide material.

9. The method of claim 7 wherein the step of providing a heating thermal path comprises setting a heat flow rate of said heating thermal path by placing an other second thermally resistant element in said heating thermal path.

10. The method of claim 9 wherein said other thermally resistant element comprises a thin air gap.

11. The method of claim 9 wherein the step of maintaining the temperature of said article comprises:

providing an article heating element having an article heating thermal path to said article; and providing an article cooling path between said article and said cooling element.

12. The method of claim 11 wherein the step of providing said article heating element comprises setting a heat flow rate of said article heating thermal path by providing a heat flow resistant element in said article heating path.

13. The method of claim 12 wherein said heat flow resistant element in said article heating path comprises a thin air gap.

14. The method of claim 1 wherein the reactor further comprises an article within the reactor containing a material which scavenges the etching species, the method further comprising the step of:

maintaining a temperature of the article and said temperature of the interior wall at respective temperatures which in conjunction produce a desired content ratio of the non-etching species and the etching species in the plasma.

15. The method of claim 14, wherein the desired content ratio corresponds to a content ratio which produces the etch-preventing polymer which is impervious to attack by the etching species of the plasma.

16. The method of claim 15, wherein the temperature of the article is maintained between 230 and 300 degrees C. and the temperature of the interior wall is maintained between 170 and 230 degrees C.

17. The method of claim 16, wherein the temperature of the interior wall is maintained between 210 and 225 degrees C.

18. The method of claim 1 wherein said sufficient power is a function of a difference between a temperature measured on a portion of said reactor near said interior wall and a temperature for that portion corresponding to a temperature of said interior wall which is above said characteristic deposition temperature.

19. The method of claim 3 wherein said portion is an outer surface of said reactor adjacent said interior wall.

20. The method of claim 1, wherein the temperature of the interior wall is maintained between 170 and 230 degrees C.

21. The method of claim 20 wherein the reactor further comprises an etching species scavenging article within the reactor comprising silicon, the method further comprising the step of:

maintaining a temperature of the article above the temperature of the interior wall.

22. The method of claim 1 wherein said reactor comprises an inductively coupled reactor having a cylindrical helical RF antenna surrounding a chamber of said reactor, and wherein said interior wall comprises a cylindrical quartz side wall supporting said antenna.

23. The method of claim 1 wherein the reactor further comprises an etching species scavenging article comprising silicon within the reactor, the method further comprising the step of:

maintaining a temperature of the article above the temperature of the interior wall.

24. The method of claim 1, further comprising the step of:

predetermining a temperature difference; and wherein, the applying step maintains the temperature of the interior wall above the characteristic deposition temperature by said temperature difference.

25. The method of claim 1, wherein the gas introduced into the reactor is $C_2F_6$, the etch-preventing polymer is comprised of carbon and fluorine and the characteristic deposition temperature of the polymer is approximately 170 degrees C.

26. The method of operating a semiconductor processing reactor, comprising the steps of:

placing a substrate onto a surface of a support within a processing chamber of the reactor;

providing a solid source of silicon in a space within the chamber above the surface of the support, said chamber having a wall above the surface of the support;

introducing into the chamber a gas comprising at least a first component capable of etching a material of the substrate;

maintaining a surface of the solid source of silicon at a first temperature; and, maintaining a surface a surface of the wall at a second temperature lower than the first temperature.

27. The method of claim 26, further comprising the step of:

forming a plasma of the gas within the chamber.

28. The method of claim 27, wherein the first component of the gas comprises a fluorocarbon gas.

29. The method of claim 28, wherein the fluorocarbon gas forms a carbon-containing polymer and wherein the second temperature is above a condensation temperature of the carbon-containing polymer.

30. The method of claim 29, wherein the wall comprises a dielectric material.

31. The method of claim 30, wherein the dielectric material comprises quartz.

32. The method of claim 29, wherein the second temperature is in a range of 170 to 230 degrees C.

33. The method of claim 29, wherein the step of forming a plasma comprises the step of:

coupling RF energy into the chamber through a coil antenna.

34. The method of claim 33, wherein the coil antenna is separated from the chamber by the wall, said wall comprising a dielectric material.

35. The method of claim 34, wherein the dielectric material of the wall comprises quartz.

36. The method of claim 26, wherein the second temperature is in a range of 170 to 230 degrees C.

37. A plasma etch reactor having a vacuum chamber into which a gas is introduced which disassociates as a plasma into an etch species which etches oxide films on a work .piece in the reactor and a non-etching species combinable with the etch species into an etch-preventing polymer condensable onto the workpiece below a characteristic deposition temperature, said reactor comprising;

an interior wall of said chamber, said interior wall comprising a material which scavenges said etching species:

means for maintaining a temperature of said interior wall above said characteristic deposition temperature of said etch-preventing polymer, said means for maintaining said temperature comprising, a heating element near said interior wall, and control means for applying sufficient power to said heating element so as to maintain the temperature of said interior wall above said characteristic deposition temperature:

an article comprising a ceiling of a chamber of said reactor containing a material which scavenges said etching species; and control means for maintaining a temperature of said article at a temperature corresponding to a desired content ratio of said non-etching species and said etching species in said plasma.

38. The reactor of claim 37 wherein said means for maintaining the temperature of said interior wall further comprises:

a cooling element overlying said ceiling;

a cooling thermal path between said interior wall and said cooling element having a first heat flow rate greater than a heat flow rate from said plasma to said interior wall; and a heating thermal path between said interior wall and said heating element having a heat flow rate greater than said first heat flow rate.

39. The reactor of claim 38 further comprising a first thermally resistant element in said cooling thermal path.

40. The reactor of claim 39 further comprising an other thermally resistant element in said heating thermal path.

41. The reactor of claim 40 wherein said means for controlling the temperature of said article comprises:

an article cooling path between said article and said cooling element having a heat flow rate greater than the rate of heat flow from said plasma to said article; and an article heating element having an article heating thermal path to said article with a heat flow rate greater than that of said article cooling path.

42. The reactor of claim 41 further comprising a heat flow resistant element in said article heating path.

43. The reactor of claim 42 wherein said heat flow resistant element in said article heating path comprises a thin air gap.

44. The reactor of claim 40 wherein said other thermally resistant element comprises a thin air gap.

45. The reactor of claim 39 wherein said first thermally resistant element comprises polyamide material.

46. The reactor of claim 37 wherein said desired content ratio in said plasma corresponds to a content ratio of said non-etching species in said polymer at which said polymer is impervious to attack by said etching species in said plasma.

47. The reactor of claim 46 wherein said etching species comprises fluorine and said non-etching species comprises carbon and wherein said gas comprises a carbon-fluorine gas.

48. The reactor of claim 47 wherein said interior wall comprises quartz and said scavenging article comprises silicon.

49. A plasma etch reactor having a vacuum chamber into which a gas is introduced which disassociates as a plasma into an etch species which etches oxide films on a work piece in the reactor and a non-etching species combinable with the etch species into an etch-preventing polymer condensable onto the work piece below a characteristic deposition temperature, said reactor comprising:

an interior wall of said chamber, said interior wall comprising a material which scavenges said etching species; and means for maintaining a temperature of said interior wall above said characteristic deposition temperature of said etch-preventing polymer, wherein said characteristic deposition temperature is approximately 170 degrees C., and wherein said means for maintaining said temperature comprises, a heating element near said interior wall, and control means for applying sufficient power to said heating element so as to maintain the temperature of said interior wall above said characteristic deposition temperature, wherein the control means sets a difference temperature and maintains the temperature of the interior wall above the characteristic deposition temperature of the etch-preventing polymer by the set difference temperature.

* * * * *

UNITED STATES PATENT AND TRADEMARK OFFICE
CERTIFICATE OF CORRECTION

PATENT NO : 5,477,975
DATED : December 26, 1995
INVENTOR(S): Michael Rice, Jeffrey Marks, David W. Groechel, Nicolas J. Bright It is certified that error appears in the above-identified patent and that said Letters Patent is hereby corrected as shown below:

On the title page,

---Assignee: Applied Materials, Inc., Santa Clara, Calif.---

Signed and Sealed this

First Day of May, 2001

Attest:

NICHOLAS P. GODICI

Attesting Officer

Acting Director of the United States Patent and Trademark Office